United States Patent [19]

Macelwee et al.

[11] Patent Number: 4,804,633
[45] Date of Patent: Feb. 14, 1989

[54] SILICON-ON-INSULATOR SUBSTRATES ANNEALED IN POLYSILICON TUBE

[75] Inventors: Thomas W. Macelwee, Ottawa; Iain D. Calder, Kanata, both of Canada

[73] Assignee: Northern Telecom Limited, Montreal, Canada

[21] Appl. No.: 157,022

[22] Filed: Feb. 18, 1988

[51] Int. Cl.[4] .................. H01L 21/425; F27D 7/06; C21D 9/00
[52] U.S. Cl. .................................... 437/24; 437/25; 437/26; 437/247; 148/33.3; 373/111; 432/261
[58] Field of Search ....................... 437/24, 25, 26, 247

[56] References Cited

U.S. PATENT DOCUMENTS 3,867,497  2/1975  Teich et al. ........................... 264/81
4,040,849  8/1977  Greskovich et al. ................. 264/65

OTHER PUBLICATIONS

Izumi et al., Electron. Lett. 14, 593 (1978).
Lam et al., J. Cryst. Growth 63, 546 (1985).
Stoemenos et al., J. Cryst., Growth 73, 546 (1985).
Celler et al., Appl. Phys. Lett. 48, 532 (1986).

Primary Examiner—O. Chaudhuri
Attorney, Agent, or Firm—C. W. Junkin

[57] ABSTRACT

A silicon-on-insulator substrate having a very low threading dislocation density is made by implanting oxygen ions into a silicon substrate while heating the substrate to form a layer of silicon dioxide buried in the silicon substrate and annealing the implanted substrate at high temperature in a novel furnace incorporating a polysilicon tube to constrain the annealing temperature to be uniform over the entire substrate. The silicon-on-insulator substrate is particularly useful for the manufacture of semiconductor devices formed in thin silicon films.

10 Claims, 3 Drawing Sheets

SILICON-ON-INSULATOR SUBSTRATES ANNEALED IN POLYSILICON TUBE

The present invention relates to the manufacture of silicon-on-insulator substrates.

It is known to form a buried layer of silicon dioxide in a silicon substrate in order to define a thin layer of silicon which is dielectrically isolated from the bulk silicon of the substrate by the buried layer of silicon dioxide. The resulting structure is called a silicon-on-insulator (SOI) substrate.

Electronic devices formed in the thin silicon layer of a SOI substrate are known to offer several advantages over similar devices formed in bulk silicon substrates. For example, the speed and power consumption of the resulting devices is improved, the latch-up phenomenon in complementary metal-oxide-semiconductor (CMOS) circuits is eliminated, circuit design and device processing are simplified, short channel effects are reduced, and radiation hardness is greatly increased.

In the currently favoured process for making SOI substrates, as first described by Izumi et al, Electron. Lett. 14, 593 (1978) and reviewed by Lam et al, J. Cryst. Growth 63, 546 (1985), a silicon wafer is provided with a sacrificial layer of silicon dioxide and a very high dose of oxygen ions, typically more than $2 \times 10^{18}$ O+ ions per square centimeter, is implanted at approximately 150 keV through sacrificial layer and into the silicon wafer while the silicon wafer is heated to approximately 500 degrees Celsius. The sacrificial layer protects the silicon wafer against surface damage during implantation. The heating of the silicon wafer during implantation causes the implanted oxygen to react with silicon to form a buried silicon dioxide layer.

The implantation process leaves a damaged single crystal silicon layer overlying the buried silicon dioxide layer. Annealing at 1150 degrees Celsius to 1200 degrees Celsius for two hours removes some of the damage from the overlying silicon layer. The annealing is carried out in a furnace comprising a quartz tube wound with a resistive heating element.

Unfortunately, some defects remain in the silicon layer after annealing. These defects, which include silicon dioxide precipitates, slip, and threading dislocations, limit the performance of MOS devices formed in the overlying silicon layer. It is generally necessary to add undamaged silicon to the overlying silicon layer by epitaxial deposition so as to provide high quality silicon in which high performance MOS devices may be formed. Wafer warpage is also a problem.

Higher temperature annealing processes have been used to improve the quality of the overlying silicon layer by eliminating silicon dioxide precipitates. For example, Stoemenos et al, J. Cryst. Growth 73, 546 (1985) report annealing at 1300 degrees Celsius for six hours, and Celler et al, Appl. Phys. Lett. 48, 532 (1986) reports annealing at 1405 degrees Celsius for half an hour. However, wafer warpage and slip remain even after high temperature annealing. Moreover, up to $10^9$ threading dislocations per square centimetre may remain in the overlying silicon layer even after high temperature annealing. These threading dislocations, when decorated with impurities, may significantly degrade the leakage and breakdown characteristics of devices formed in the overlying silicon layer.

The present invention seeks to provide a method and apparatus for making silicon-on-insulator substrates which obviate or mitigate the problems described above.

The present invention also seeks to provide an improved silicon-on-insulator substrate.

According to one aspect of the invention there is provided a method for making a silicon-on-insulator substrate comprising:

implanting oxygen ions into a bare silicon substrate while heating the substrate to form an layer of silicon dioxide buried in the silicon substrate;

placing the implanted substrate within a polysilicon tube; and maintaining the tube and the substrate at a temperature exceeding 1300 degrees Celsius to anneal the substrate.

The polysilicon tube is a very efficient conductor of heat and therefore constrains the temperature therein to be both radially and axially uniform. As a result, the temperature is constrained to be uniform over the entire substrate during the annealing process. Silicon-on-insulator substrates made using the above method have less than $10^6$ threading dislocations per square centimeter. It is believed that the temperature uniformity accounts for the very low threading dislocation densities obtained using the method according to the invention.

Thus, according to the invention there is also provided a method for making a silicon-on-insulator substrate comprising:

implanting oxygen ions into a bare silicon substrate while heating the substrate to form an layer of silicon dioxide buried in the silicon substrate; and annealing the implanted substrate at a temperature exceeding 1300 degrees Celsius while constraining said temperature to be uniform to within one degree Celsius over the entire substrate.

In the methods according to the invention, oxygen is implanted into a bare silicon wafer, in contrast to currently favoured processes in which oxygen is implanted into a silicon wafer coated with a sacrificial layer of silicon dioxide. While the omission of the sacrificial layer may permit somewhat more damage to the surface of the silicon wafer during implantation, this damage is largely removed during subsequent annealing. It is believed that during implantation the sacrificial layer may play a role in the formation of threading dislocations by a mechanism not yet understood.

The methods according to the invention provide a silicon-on-insulator substrate having a high quality silicon layer in which high performance MOS devices may be formed. It is not necessary to deposit silicon epitaxially as is required in currently favoured processes to provide high quality silicon in which high performance MOS devices may be formed.

Thus, according to another aspect of the invention there is provided a silicon-on-insulator substrate comprising a silicon wafer having a layer of silicon dioxide buried therein to define a dielectric layer and a thin silicon layer overlying said dielectric layer, said thin silicon layer having less than $10^6$ threading dislocations per square centimeter.

According to yet another aspect of the invention there is provided a furnace for annealing silicon-on-insulator substrates, comprising:

a quartz tube wound with at least one resistive heating element; and a polysilicon tube within said quartz tube.

The polysilicon tube provides a uniform temperature distribution during annealing as is required for a low threading dislocation density in the annealed silicon-on-insulator substrate.

An embodiment of the invention will now be described by way of example only with reference to the accompanying drawings in which.

Figure 1:
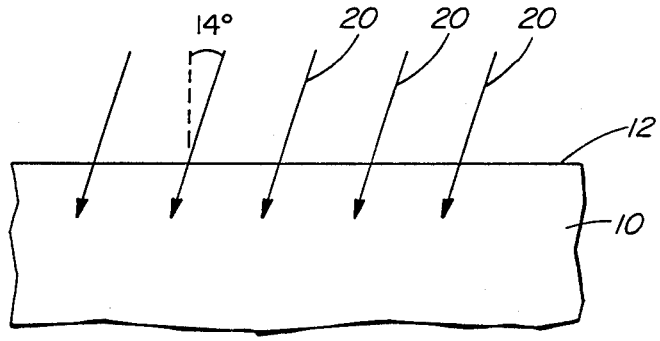
FIGS. 1 to 6 are cross-sectional views of a silicon-on-insulator substrate at successive steps in its manufacture.

Referring to FIG. 1, in a method for making a silicon-on-insulator substrate according to the embodiment, a substrate in the form of a bare silicon wafer 10 of <100> orientation is implanted with $1.5 \times 10^{18}$ O+ ions 20 per square centimeter at a beam energy of 150 keV and a beam current of 60 mA while heating the wafer 10 to 520 degrees Celsius. The ions 20 are implanted in a direction inclined 14 degrees to a direction normal to a surface 12 of the silicon wafer 10 so as to avoid ion channelling.

Figure 2:
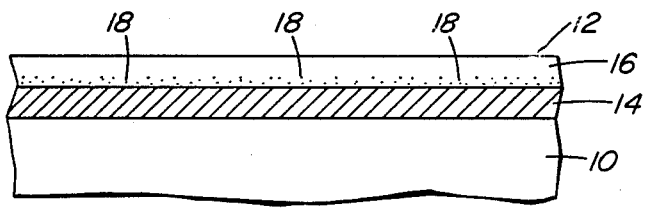

As shown in FIG. 2, the implanted ions 20 react with silicon of the wafer 10 to form a buried layer 14 of silicon dioxide. A layer 16 of damaged silicon overlies the layer 14 of silicon dioxide. The damaged silicon layer 16 includes silicon dioxide precipitates 18 and up to $10^9$ threading dislocations per square centimeter.

Figure 3:
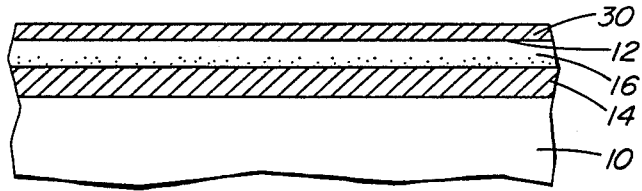

As shown in FIG. 3, a 3000 angstrom silicon dioxide cap layer 30 is deposited by low pressure chemical vapour deposition (LPCVD) to passivate the surface 12 of the silicon wafer.

Figure 4:
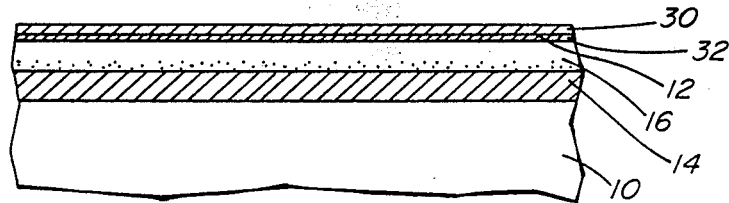

The wafer is then inserted into a novel annealing furnace described below which has been preheated to 800 degrees Celsius. An oxygen ambient is supplied to the furnace and the furnace temperature is increased to 1000 degrees Celsius where it is maintained for at least one half hour to densify the cap layer 30 and to grow a thermal oxide layer 32 approximately 100 angstroms thick at the surface 12 of the wafer as shown in FIG. 4.

Figure 5:
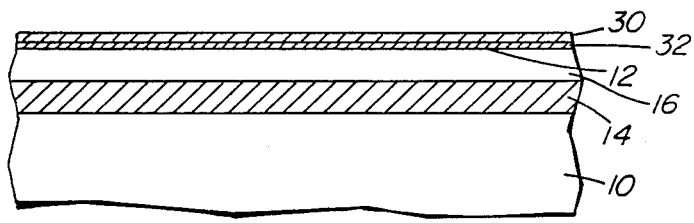

A nitrogen ambient is then supplied to the furnace and the furnace temperature is increased to 1330 degrees Celsius where it is maintained for at least six hours to anneal the wafer 10. As described below, the furnace is particularly adapted to provide a highly uniform temperature over the entire substrate during the annealing operation by the incorporation of a polysilicon tube into which the wafer 10 is inserted. As shown in FIG. 5, the annealing step removes silicon dioxide precipitates 18 from the damaged silicon layer 16 and reduces the threading dislocation density to less than $10^6$ dislocations per square centimeter. The cap layer 30 and thermal oxide layer 32 prevent nitridation of the silicon layer 16 during the high temperature annealing operation.

The optical reflectivity of the overlying silicon layer 16 is monitored to assess the progress of the annealing operation. A green light helium-neon (HeNe) laser operating at a wavelength of 543.5 nm is used for this purpose. A conventional red HeNe laser would be ineffective due to the intense background of red light generated by the furnace at 1330 degrees Celsius.

Figure 6:
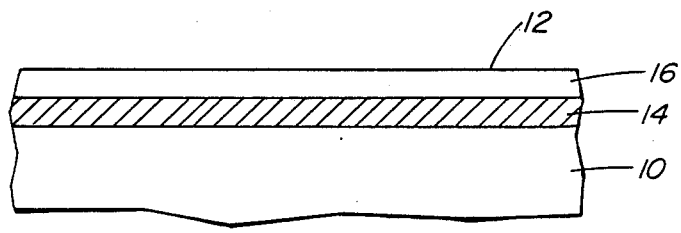

The furnace temperature is reduced to 800 degrees Celsius, and the wafer 10 is then removed from the furnace. The cap layer 30 and thermal oxide layer 32 are removed by chemical etching to produce the silicon-on-insulator substrate shown in FIG. 6. Semiconductor devices may then be formed in the upper silicon layer 16 using known techniques.

Figure 7:
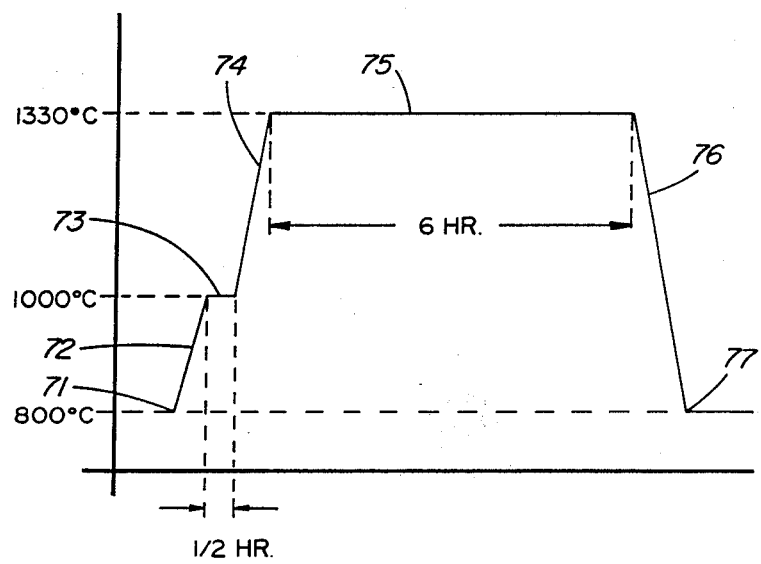
FIG. 7 is a graph showing temperature versus time for an annealing step in the manufacture of the silicon-on-insulator substrate of FIGS. 1 to 6.

FIG. 7 is a graphical representation of the heating steps comprising the annealing operation. The wafer 10 is inserted into the novel furnace which has been preheated to 800 degrees Celsius as shown at reference numeral 71, the furnace temperature is raised to 1000 degrees Celsius over approximately one half hour as shown at reference numeral 72 and held at 1000 degrees Celsius as shown at reference numeral 73 for at least one half hour to consolidate the cap oxide 30 and to grow the thermal oxide 32. The furnace temperature is then raised to 1330 degrees Celsius over approximately one half hour as shown at reference numeral 74, and held at 1330 degrees Celsius for six hours as shown at reference numeral 75 to remove the silicon dioxide precipitates 18 and to reduce the threading dislocation density. The furnace temperature is then reduced to 800 degrees Celsius over approximately one hour as shown at reference numeral 76, and the wafer 10 is withdrawn from the furnace as shown at reference numeral 77.

Figure 8:
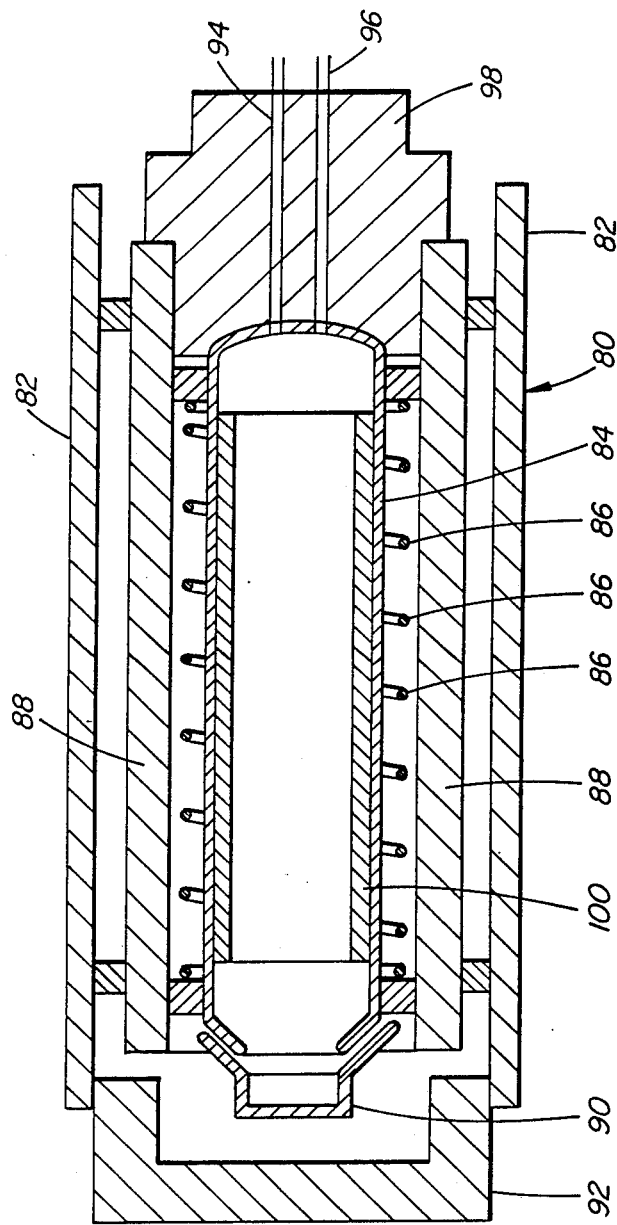
FIG. 8 is a cross-sectional view of an annealing furnace used in the annealing step.

FIG. 8 shows a novel furnace 80 used for the annealing operation. The furnace 80 comprises a furnace frame 82 which carries a quartz tube 84. The quartz tube 84 is wound with a resistive heating element 86 housed in an insulating element case 88 carried by the frame 82. The element case prevents excessive radial heat loss from the furnace so as to reduce radial temperature gradients within the furnace. An air space is provided between the resistive heating element 86 and the quartz tube 84 to permit reasonably rapid cooling of the quartz tube 84 while maintaining good control of the temperature within the quartz tube 84.

One end of the quartz tube 84 is provided with a removable quartz end cap 90 which is housed within a removable insulated scavenger box 92 carried by the frame 82. The end cap 90 and scavenger box 92 are made removable to permit insertion and removal of wafers. Another end of the quartz tube 84 is provided with inlet and outlet conduits 94, 96 for insertion and removal of gases. The inlet and outlet conduits 94,96 pass through an insulating plug 98. The scavenger box 92 and plug 98 act as insulating means to prevent excessive heat radiation from the ends of furnace so as to reduce axial temperature gradients within the furnace.

Temperature gradients within the furnace are further constrained by a polysilicon tube 100 carried within the quartz tube 84. The polysilicon tube 100 acts as an efficient thermal conductor to reduce temperature gradients within the furnace and provides mechanical support to the quartz tube 84 which may soften and sag at temperatures above 1200 degrees Celsius. Unlike the quartz tube 84, the polysilicon tube 100 is opaque to infrared radiation from the resistive heating elements 86 which can also contribute to temperature nonuniformities within the quartz tube 84. Thermocouple measurements indicate that the temperature variation within the polysilicon tube 1 is less than 0.1 degrees Celsius at a furnace temperature of 1330 degrees Celsius. Thus, the polysilicon tube 100 constrains the temperature of the wafer 10 to be uniform to within 0.1 degree Celsius over the entire wafer when the wafer is heated within the polysilicon tube 100.

The maintenance of a highly uniform temperature over the entire wafer 10 during the annealing operation is believed to be critical to the achievement of very low threading dislocation densities. Silicon-on-insulator substrates having threading dislocation densities as low as $8 \times 10^5$ dislocations per square centimetre have been achieved using the method and apparatus described above. Very smooth interfaces between the buried silicon dioxide layer 14 and the overlying silicon layer 16 have also been achieved, the roughness of this interface being less than 20 angstroms.

Cleanliness of the annealing operation is improved by oxidizing the interior of the polysilicon tube 100 before inserting silicon wafers for annealing. This may be achieved by heating the empty silicon tube 100 to approximately 1000 degrees Celsius in an oxidizing atmosphere, typically pure oxygen, for approximately one half hour.

We claim:

1. A method for making a silicon-on-insulator substrate comprising:
   implanting oxygen ions into a bare silicon substrate while heating the substrate to form a layer of silicon dioxide buried in the silicon substrate;
   placing the implanted substrate within a polysilicon tube; and
   maintaining the tube and the substrate at a temperature exceeding 1300 degrees Celsius to anneal the substrate.

2. A method as defined in claim 1, comprising implanting $1.5 \times 10^{18}$ oxygen ions per square centimeter at an energy of 150 keV and a beam current of 60 mA while maintaining the substrate at 520 degrees Celsius.

3. A method as defined in claim 2, comprising implanting the oxygen ions in a direction inclined 14 degrees to a direction normal to a surface of the substrate.

4. A method as defined in claim 1, comprising maintaining the tube and the substrate at 1330 degrees Celsius for at least 6 hours to anneal the substrate.

5. A method as defined in claim 4, comprising heating the polysilicon tube to 800 degrees Celsius before inserting the implanted substrate therein, increasing the tube temperature to 1330 degrees Celsius, maintaining the tube temperature at 1330 degrees Celsius for at least 6 hours to anneal the substrate, decreasing the tube temperature to 800 degrees Celsius, and removing the annealed substrate from the tube.

6. A method as defined in claim 5, comprising forming a cap layer of silicon dioxide on the implanted substrate before annealing the substrate.

7. A method as defined in claim 6, comprising maintaining the tube temperature at 1000 degrees Celsius with an oxygen ambient therein for at least thirty minutes before increasing the tube temperature to 1330 degrees Celsius.

8. A method as defined in claim 6, comprising densifying the cap layer and forming a thermal oxide at the interface of the cap layer and the substrate before annealing the substrate.

9. A method as defined in claim 1, comprising monitoring the optical reflectivity of the substrate during annealing of the substrate.

10. A method for making a silicon-on-insulator substrate, comprising implanting oxygen ions into a bare silicon substrate while heating the substrate to form a layer of silicon dioxide buried in the silicon substratae, and annealing the implanted substrate at a temperature exceeding 1300 degrees Celsius while constraining the temperature of the substrate to be uniform during annealing to within one degree Celsius over the entire substrate by heating the substrate within a polysilicon tube.

* * * * *